United States Patent
Fukazawa

(10) Patent No.: US 12,365,983 B2
(45) Date of Patent: Jul. 22, 2025

(54) METHODS FOR FORMING A BORON NITRIDE FILM BY A PLASMA ENHANCED ATOMIC LAYER DEPOSITION PROCESS

(71) Applicant: ASM IP Holding B.V., Almere (NL)

(72) Inventor: Atsuki Fukazawa, Tama (JP)

(73) Assignee: ASM IP Holding B.V., Almere (NL)

( * ) Notice: Subject to any disclaimer, the term of this patent is extended or adjusted under 35 U.S.C. 154(b) by 63 days.

(21) Appl. No.: 18/142,734

(22) Filed: May 3, 2023

(65) Prior Publication Data

US 2023/0272527 A1    Aug. 31, 2023

Related U.S. Application Data

(62) Division of application No. 16/835,283, filed on Mar. 30, 2020, now abandoned.

(60) Provisional application No. 62/830,270, filed on Apr. 5, 2019.

(51) Int. Cl.
  *C23C 16/34* (2006.01)
  *C23C 16/455* (2006.01)

(52) U.S. Cl.
  CPC ...... *C23C 16/45536* (2013.01); *C23C 16/342* (2013.01)

(58) Field of Classification Search
  CPC .................................................. C23C 16/342
  See application file for complete search history.

(56) References Cited

U.S. PATENT DOCUMENTS

| | | | | |
|---|---|---|---|---|
| 9,805,974 | B1 * | 10/2017 | Chen | C23C 16/08 |
| 2015/0125628 | A1 * | 5/2015 | Kim | C23C 16/308 |
| | | | | 427/579 |
| 2015/0284848 | A1 * | 10/2015 | Nakano | C23C 16/45561 |
| | | | | 137/14 |
| 2015/0287588 | A1 * | 10/2015 | Sano | C23C 16/45542 |
| | | | | 118/704 |
| 2016/0293410 | A1 * | 10/2016 | Lei | C07F 5/022 |
| 2017/0022612 | A1 * | 1/2017 | Lei | C23C 16/342 |

FOREIGN PATENT DOCUMENTS

TW    201638097 A    * 11/2016    ............. C07F 5/022

OTHER PUBLICATIONS

USPTO; Final Office Action dated Nov. 22, 2021 in U.S. Appl. No. 16/835,283.
USPTO; Advisory Action dated Jan. 28, 2022 in U.S. Appl. No. 16/835,283.
USPTO; Non-Final Office Action dated Apr. 5, 2022 in U.S. Appl. No. 16/835,283.

(Continued)

*Primary Examiner* — David P Turocy
(74) *Attorney, Agent, or Firm* — Snell & Wilmer L.L.P.

(57) ABSTRACT

Methods for forming a boron nitride film by a plasma enhanced atomic layer deposition (PEALD) process are provided. The methods may include: providing a substrate into a reaction chamber; and performing at least one unit deposition cycle of a PEALD process, wherein a unit cycle comprises, contacting the substrate with a vapor phase reactant comprising a boron precursor, wherein the boron precursor comprises less than or equal to two halide atoms per boron atom; and contacting the substrate with a reactive species generated from a gas comprising a nitrogen precursor.

20 Claims, 3 Drawing Sheets

(56) References Cited

OTHER PUBLICATIONS

Figure 1:
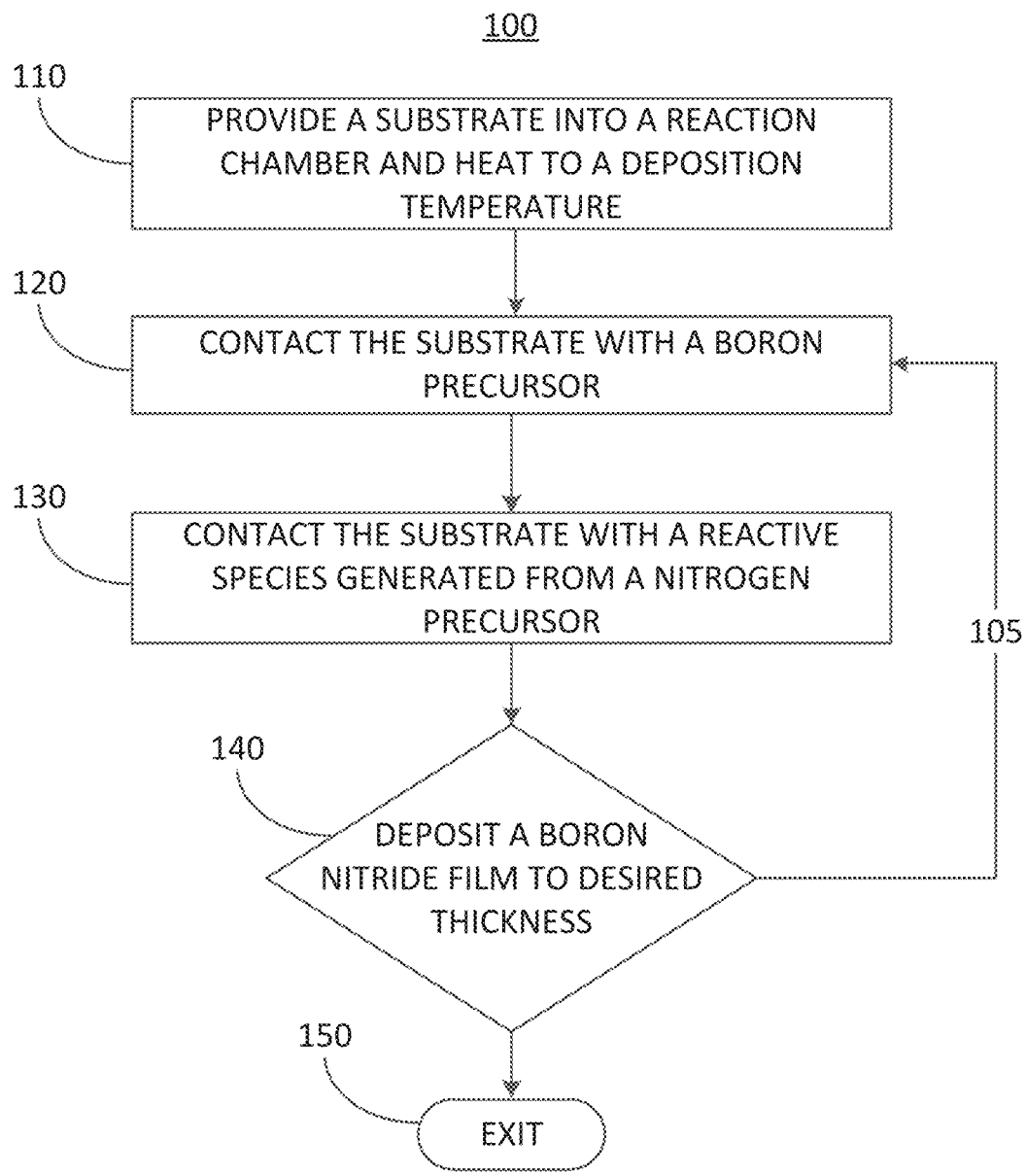

USPTO; Final Office Action dated Jul. 15, 2022 in U.S. Appl. No. 16/835,283.
USPTO; Advisory Action dated Sep. 22, 2022 in U.S. Appl. No. 16/835,283.
USPTO; Non-Final Office Action dated Oct. 26, 2022 in U.S. Appl. No. 16/835,283.
USPTO; Final Office Action dated Feb. 14, 2023 in U.S. Appl. No. 16/835,283.

* cited by examiner

METHODS FOR FORMING A BORON NITRIDE FILM BY A PLASMA ENHANCED ATOMIC LAYER DEPOSITION PROCESS

CROSS-REFERENCE TO RELATED APPLICATION

This application is a divisional of, and claims priority to, U.S. patent application Ser. No. 16/835,283 filed Mar. 30, 2020 titled METHODS FOR FORMING A BORON NITRIDE FILM BY A PLASMA ENHANCED ATOMIC LAYER DEPOSITION PROCESS; which claims the benefit of U.S. Provisional Application No. 62/830,270, filed on Apr. 5, 2019, in the United States Patent and Trademark Office, the disclosures of which are incorporated herein in their entirety by reference.

FIELD OF INVENTION

The present disclosure generally relates to methods for forming a boron nitride film and particularly methods for depositing a boron nitride film by performing at least one unit deposition cycle of a plasma enhanced atomic layer deposition (PEALD) process.

BACKGROUND OF THE DISCLOSURE

Boron Nitride (BN) films may have a low dielectric constant in a range from about 2.2 to 5, depending on the deposition method and conditions and may therefore have potential applications for dielectric films. Boron nitride films may also have excellent mechanical resistance against chemical mechanical polishing (CMP) slurries and therefore boron nitride films may be utilized as a CMP stop layer in a polishing process. In further applications, boron nitride films may exhibit excellent etch selectivity to both silicon dioxide films ($SiO_2$) and silicon nitride films ($Si_3N_4$) in both wet etching and plasma etching applications and therefore boron nitride films may be utilized as an etch hard mask.

Common methods for depositing boron nitride films utilize plasma enhanced chemical vapor deposition (PECVD) process which results in non-conformal films which may be unsuitable for non-planar substrates including high aspect ratio features.

Accordingly, methods for depositing conformal boron nitride films over non-planar substrates with high step coverage are highly desirable.

SUMMARY OF THE DISCLOSURE

In accordance with at least one embodiment of the disclosure, a method for forming a boron nitride film by a plasma enhanced atomic layer deposition (PEALD) process is provided. The method may comprise: providing a substrate into a reaction chamber; and performing at least one unit deposition cycle of a PEALD process, wherein a unit deposition cycle comprises: contacting the substrate with a vapor phase reactant comprise a boron precursor, wherein the boron precursor comprises less than or equal to two halide atoms per boron atom; and contacting the substrate with a reactive species generated from a plasma produced from a gas comprising a nitrogen precursor.

For the purpose of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

Figure 2:
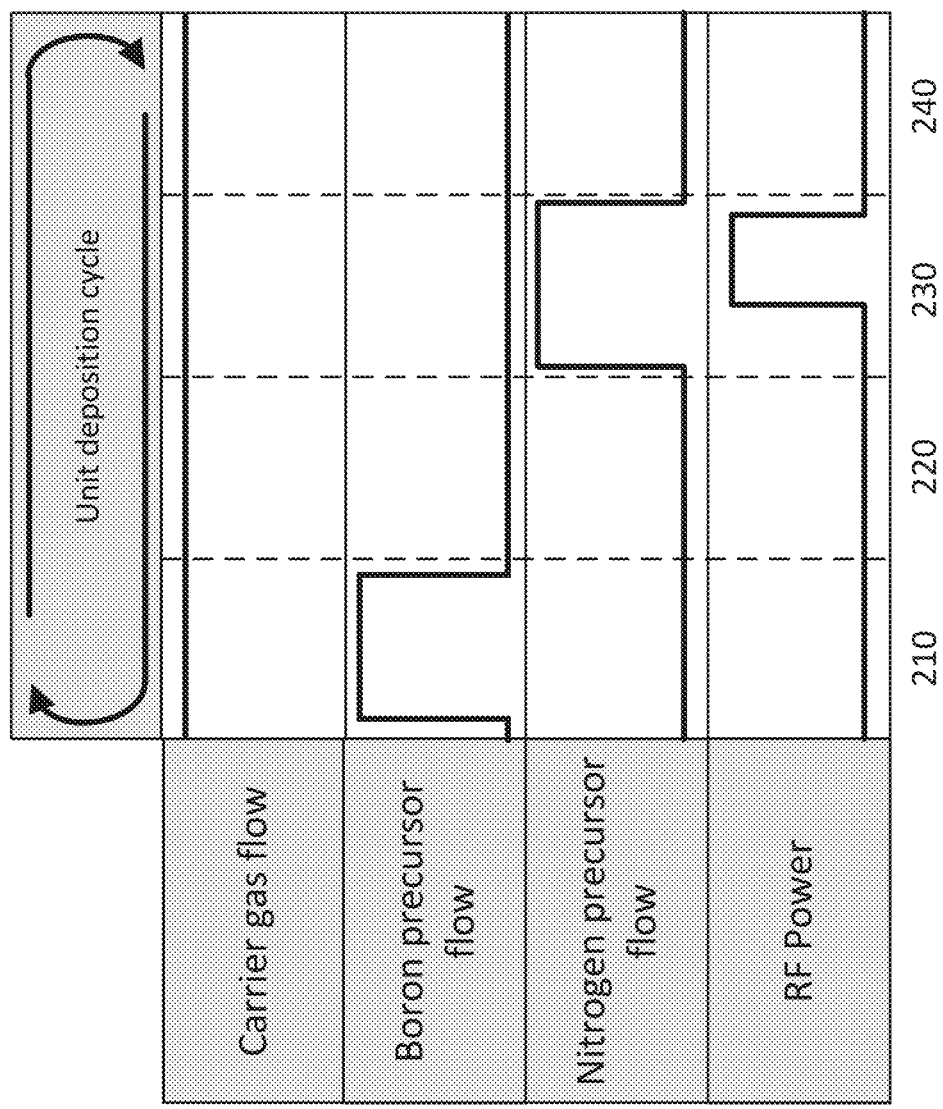
Figure 3:
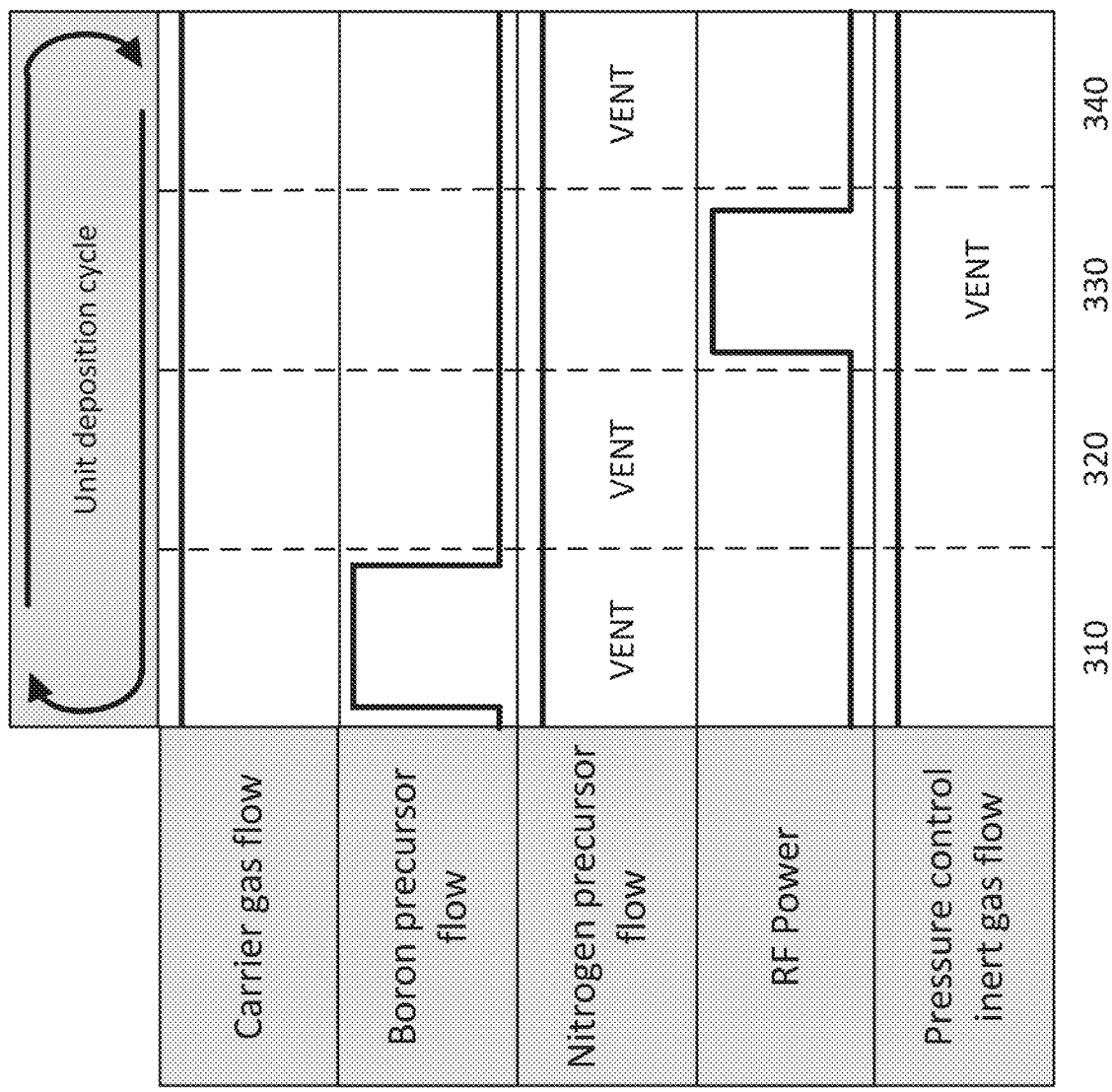

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawing, in which:

FIG. 1 illustrates an exemplary process flow diagram illustrating a plasma enhanced atomic layer deposition (PEALD) process for forming a boron nitride film in accordance with the embodiments of the disclosure;

FIG. 2 schematically illustrates an exemplary unit deposition cycle of a PEALD process for depositing a boron nitride film according to the embodiments of the disclosure; and FIG. 3 schematically illustrates a further exemplary unit deposition cycle of a PEALD process for depositing a boron nitride film according to the embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials that may be used, or upon which, a device, a circuit or a film may be formed.

As used herein, the term "film" and "thin film" may refer to any continuous or non-continuous structures and material deposited by the methods disclosed herein. For example, "film" and "thin film" could include 2D materials, nanolaminates, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "plasma enhanced atomic layer deposition" (PEALD) may refer to a vapor deposition process in which deposition cycles, preferably a plurality of consecutive deposition cycles, are conducted in a reaction chamber. Typically, during each unit deposition cycle a precursor is chemisorbed to a deposition surface (e.g., a substrate surface or a previously deposited underlying surface such as material from a previous PEALD cycle), forming a monolayer or sub-monolayer that does not readily react with additional precursor (i.e., a self-limiting reaction). Thereafter, reactive species generated by a plasma produced from one or more precursors may subsequently be introduced into or generated in the process chamber for use in converting the chemisorbed precursor to the desired material on the deposition surface. Further, purging steps may also be utilized during each unit deposition cycle to remove excess precursor and reactive species from the process chamber and/or remove excess reactant, reactive species and/or reaction byproducts from the process chamber after conversion of the chemisorbed precursor.

As used herein, the term "gas" may refer to a vapor or vaporized solid and/or vaporized liquid and may be constituted by a single gas or a mixture of gases.

A number of example materials are given throughout the embodiments of the current disclosure, it should be noted that the chemical formulas given for each of the example materials should not be construed as limiting and that the non-limiting example materials given should not be limited by a given example stoichiometry.

In the specification, it will be understood that the term "on" or "over" may be used to describe a relative location relationship. Another element or layer may be directly on the mentioned layer, or another layer (an intermediate layer) or element may be intervened therebetween, or a layer may be disposed on a mentioned layer but not completely cover a surface of the mentioned layer. Therefore, unless the term "directly" is separately used, the term "on" or "over" will be construed to be a relative concept. Similarly to this, it will be understood the term "under," "underlying," or "below" will be construed to be relative concepts.

The embodiments of the disclosure may include methods for forming a boron nitride film by a plasma enhanced atomic layer deposition (PEALD) process and particularly methods for depositing a boron nitride film utilizing a boron precursor which comprises less than or equal to two halide atoms per boron atom.

The embodiments of the disclosure may therefore include methods for forming a boron nitride film by a plasma enhanced atomic layer deposition (PEALD) process, the method comprising: providing a substrate into a reaction chamber; and performing at least one unit deposition cycle of a PEALD process, wherein a unit deposition cycle comprises: contacting the substrate with a vapor phase reactant comprising a boron precursor, wherein the boron precursor comprises less than or equal to two halide atoms per boron atom; and contacting the substrate with a reactive species generated from a plasma produced from a gas comprising a nitrogen precursor.

Therefore, in some embodiments of the disclosure, plasma enhanced atomic layer deposition (PEALD) processes are used to deposit boron nitride (BN) films. Briefly, a substrate or a workpiece is placed in a reaction chamber and subjected to alternatively repeated surface reactions. In some embodiments, BN films are formed by repetition of a self-limiting ALD cycle. In some embodiments, each PEALD unit deposition cycle comprises at least two distinct phases. The provision and removal of a reactant from the reaction space may be considered a phase.

In a first phase, a first reactant comprising a boron precursor may be provide into the reaction chamber and may form no more than about one monolayer on the substrate surface. This reactant is also referred to herein as the "the boron precursor," "boron-containing precursor," or "boron reactant" and may be, for example, a vapor phase reactant comprising a boron halide precursor.

In a second phase, a second reactant comprising a reactive species is provided and may convert the absorbed boron precursor to boron nitride. In some embodiments of the disclosure, the second reactant may comprise a reactive species generated from a plasma produced from a gas comprising a nitrogen precursor.

An exemplary process 100 for depositing a boron nitride film utilizing a plasma enhanced atomic layer deposition process is illustrated with reference to FIG. 1. The exemplary process 100 may comprise two phases, a first phase comprising contacting the substrate with a boron precursor and a second phase comprising contacting the substrate with a reactive species generated from a plasma.

In more detail and with reference to FIG. 1, the exemplary process 100 may commence by means of a process block 110 which comprises, providing a substrate into a reaction chamber and heating the substrate to a suitable deposition temperature.

In some embodiments, the substrate may comprise one or more materials and material surfaces including, but not limited to semiconductor materials, dielectric materials, and metallic materials. For example, the substrate may include semiconductor materials, such as, but not limited to, silicon (Si), germanium (Ge), germanium tin (GeSn), silicon germanium (SiGe), silicon germanium tin (SiGeSn), silicon carbide (SiC), or a group III-V semiconductor material.

In some embodiments of the disclosure, the substrate may comprise a patterned substrate including high aspect ratio features, such as, for example, trench structures, vertical gap features, horizontal gap features, and/or fin structures. For example, the substrate may comprise one or more substantially vertical gap features and/or one or more substantially horizontal gap features. The term "gap feature" may refer to an opening or cavity disposed between opposing inclined sidewalls or two protrusions extending vertically from the surface of the substrate or opposing inclined sidewalls of an indentation extending vertically into the surface of the substrate, such a gap feature may be referred to as a "vertical gap feature." In some embodiments, the vertical gap features may have an aspect ratio (height:width) which may be greater than 2:1, or greater than 5:1, or greater than 10:1, or greater than 25:1, or greater than 50:1, or even greater than 100:1, wherein "greater than" as used in this example refers to a greater distance in the height of the gap feature.

In some embodiments, the substrate on which deposition is desired is loaded into a reaction chamber. In some embodiments, the reaction chamber may form a part of a cluster tool in which a variety of different processes in the formation of semiconductor device structures are carried out. In some embodiments, a flow-type reactor may be utilized. In some embodiments, a showerhead-type reactor may be utilized. In some embodiments, a space divided reactor may be utilized. In some embodiments, a high-volume manufacturing-capable single wafer PEALD reactor may be utilized. In other embodiments, a batch reactor comprising multiple substrates may be utilized. For embodiments in which a batch PEALD reactor is used, the number of substrates may be in the range of 10 to 200, or 50 to 150, or even 100 to 130.

In some embodiments, if necessary, the exposed surfaces of the substrate may be pretreated to provide reactive sites to react with the first phase of the PEALD process. In some embodiments, a separate pretreatment step is not required. In some embodiments, the substrate is pretreated to provide a desired surface termination, for example, by exposing the substrate surface to a pretreatment plasma.

In some embodiments of the disclosure, the substrate disposed within the reaction chamber may be heated to a desired deposition temperature for a subsequent cyclical deposition stage 105 of exemplary PEALD process 100 (FIG. 1). For example, the substrate may be heated to a substrate temperature of less than approximately 500° C., or less than approximately 450° C., or less than approximately 400° C., or less than approximately 350° C., or less than approximately 300° C., or less than approximately 250° C., or even less than approximately 200° C. In some embodiments of the disclosure, the substrate temperature during the exemplary plasma enhanced atomic layer deposition process 100 may be between approximately 200° C. and approximately 500° C.

In addition to controlling the temperature of the substrate, the pressure in the reaction chamber may also be regulated to enable deposition of a desired boron nitride film. In some embodiments, regulating the pressure within the reaction chamber may also control the population density and the nature of the reactive species generated within the plasma. Therefore, in some embodiments, the pressure in the reaction chamber during the exemplary PEALD process 100 may be regulated at a pressure less than 300 Pascals, or less than 200 Pascals, or even less than 100 Pascals. In some embodiments, the pressure in the reaction chamber during the exemplary PEALD process 100 may be regulated at a pressure greater than 300 Pascals, or greater than 500 Pascals, or greater than 1000 Pascals, or greater than 2000 Pascals, or even greater than 3000 Pascals. For example, in some embodiments, the pressure within the reaction chamber during the exemplary PEALD process 100 may be regulated between 100 Pascals and 3000 Pascals.

Once the temperature of substrate has been set to the desired deposition temperature and pressure in the reaction chamber has been regulated as desired, the exemplary process 100 may continue by means of a cyclical deposition stage 105 which may include providing one or more deposition gases to the reaction chamber, wherein deposition gases may include vapor phase reactants, purge gas, carrier gas, and a gas utilized to generate a reactive species from a plasma.

In brief, in a first phase of the cyclical deposition stage 105, a boron precursor may be "pulsed" into the reaction chamber, wherein the term "pulse" may be understood to comprise feeding a reactant into the reaction chamber for a predetermined amount of time. The term "pulse" does not restrict the length or duration of the pulse and a pulse may be any length of time. In some embodiments, in addition to a boron precursor a gas may be provided to the reaction chamber continuously during the cyclical deposition stage 105 of exemplary PEALD process 100. In some embodiments, the gas may comprise both a gas for generation of reactive species utilized during the second stage of the PEALD process 100 and may also be utilized as a purge gas to remove excess reactants, reactive species, and reaction byproducts from the reaction chamber.

In more detail, the cyclical deposition stage 105 of exemplary PEALD process 100 may continue by means of a process block 120 comprising, contacting the substrate with a vapor phase reactant comprising a boron precursor.

In some embodiments, the boron precursor may be provided first to the substrate. After an initial surface termination, if necessary or desired, a boron precursor pulse may be supplied to the substrate. In accordance with some embodiments, the boron precursor may be supplied to the reaction chamber along with a carrier gas flow. In some embodiments, the boron precursor may comprise a volatile boron species that is reactive with the surface(s) of the substrate. The boron precursor pulse may self-saturate the substrate surfaces such that excess constituents of the boron precursor pulse do not further react with the molecular layer formed by this process.

The boron precursor pulse is preferably supplied as a vapor phase reactant. The boron precursor gas may be considered "volatile" for the purposes of the present disclosure if the species exhibits sufficient vapor pressure under the process conditions to transport species to the substrate surface in sufficient concentration to saturate the exposed surfaces.

In some embodiments of the disclosure, the vapor phase boron precursor may comprise a boron precursor comprising less than or equal to two halide atoms per boron atom. In some embodiments, the boron precursor may comprise a boron halide precursor. In some embodiments, the boron halide precursor may comprise at least one of a boron chloride precursor, a boron iodide precursor, or a boron bromide precursor. In some embodiments, the boron halide precursor may further comprise hydrogen. In some embodiments, the boron halide precursor may further comprise a hydrocarbon group, such as, dichlorophenylborane, for example. In some embodiments, the boron halide precursor may further comprise an amine group, such as, chlorodimethylaminoborane, for example.

In some embodiments, the boron halide precursor comprises a compound having the general chemical formula (I):

wherein X=Cl, Br, or I, and R=H, $C_xH_y$, or $N_xC_yH_z$. In such embodiments, the boron halide precursor may comprise, dichlorophenylboron, or bismethylaminochloroboron.

In some embodiments, the boron halide precursor comprises a compound having the general chemical formula (II):

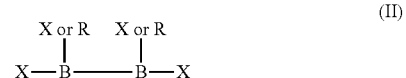

wherein X=Cl, Br, or I, and R=H, $C_xH_y$, or $N_xC_yH_z$. In such embodiments, the boron halide precursor may comprise, tetrachlorodiborane, or bischloromedimethylamine.

In some embodiments, the boron halide precursor comprises a compound having the general chemical formula (III):

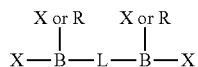

(III)

wherein X=Cl, Br, or I, and R=H, $C_xH_y$, or $N_xC_yH_z$, and L=$N_xH_y$, $N_xH_yC_z$, or $C_xH_y$. In such embodiments, the boron halide precursor may comprise bisdichlorobenzenediboronic acid.

In some embodiments, the boron halide precursor comprises a compound having the general chemical formula (IV):

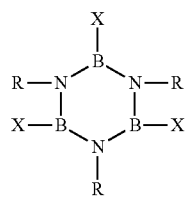

(IV)

wherein X=Cl, Br, or I, and R=H, $C_xH_y$, or $N_xC_yH_z$. In such embodiments, the boron halide precursor may comprise, tetrachlorotrimethylboron.

In some embodiments of the disclosure, the boron precursor may be pulsed into the reaction chamber for a time period from about 0.05 second to about 5.0 seconds, or from about 0.1 seconds to about 3 seconds, or even about 0.2 seconds to about 1.0 seconds. In addition, during the contacting of the substrate with the boron precursor, the flow rate of the boron precursor may be less than 200 sccm, or less than 100 sccm, or less than 50 sccm, or less than 10 sccm, or even less than 2 sccm. In addition, during the contacting of substrate with the boron precursor the flow rate of the boron precursor may range from about 2 to 10 sccm, from about 10 to 50 sccm, or from about 50 to about 200 sccm.

After sufficient time for a molecular layer to adsorb on the substrate surface, excess boron precursor may be removed from the reaction chamber. In some embodiments, the excess boron precursor may be purged by stopping the flow of the vapor phase boron precursor while continuing to flow a carrier gas, a purge gas, or a gas mixture, for a sufficient time to diffuse or purge excess reactants and reactant by-products, if any, from the reaction chamber. In some embodiments, the excess boron precursor may be purged with aid of one or more inert gases, such as nitrogen, helium or argon, that may be flowing throughout the cyclical deposition phase 105 of exemplary PEALD process 100.

In some embodiments, the boron precursor may be purged from the reaction chamber for a time period of about 0.1 seconds to about 10 seconds, or about 0.3 seconds to about 5 seconds, or even about 0.3 seconds to about 1 second. Provision and removal of the boron precursor may be considered as the first or "boron phase" of the exemplary PEALD process 100.

Upon completion of the purging the reaction chamber of excess boron precursor and any reaction by-products, the cyclical deposition stage 105 of exemplary PEALD process 100 may continue with a second phase by means of a process block 130 comprising, contacting the substrate with a reactive species generated from a plasma produced from a gas comprising a nitrogen precursor.

In the second phase, a second reactant comprising a reactive species generated from a plasma is provided to the substrate. In some embodiments, a nitrogen-based plasma is produced from a gas comprising a nitrogen precursor. In some embodiments, the nitrogen precursor may comprise at least one of nitrogen ($N_2$), ammonia ($NH_3$), hydrazine ($N_2H_4$), or an alkyl-hydrazine (e.g., tertiary butyl hydrazine ($C_4H_{12}N_2$). In some embodiments, the reactive species generated from the nitrogen-based plasma may comprise one or more of atomic nitrogen, nitrogen ions, nitrogen radicals, and excited nitrogen species.

In some embodiments, the nitrogen precursor may comprise a nitrogen containing gas and an additional gas, such as, nitrogen and hydrogen ($N_2/H_2$), for example. In some embodiments, the nitrogen containing gas (e.g., $N_2$) and the additional gas (e.g., $H_2$) may be introduced into the reaction chamber at a flow rate ratio of nitrogen containing gas to the additional greater than 1:1, or greater than 1:2, or greater than 1:3, or even equal to or greater than 1:5.

In some embodiments, a nitrogen-based plasma may be produced from the gas comprising a nitrogen precursor. For example, a nitrogen-based plasma may be generated by applying RF power from about 10 W to about 2000 W, or from about 50 W to about 1000 W, or from about 100 W to about 500 W. In some embodiments, the plasma may be generated in-situ, while in other embodiments, the plasma may be generated remotely. In some embodiments, a showerhead reactor may be utilized and plasma may be generated between a susceptor (on top of which the substrate is located) and a showerhead plate.

In some embodiments, the reactive species generated from the plasma may contact the substrate for a time period between about 0.1 seconds to about 20 seconds, or about 0.5 seconds to about 10 seconds, or even about 0.5 seconds to about 5 seconds. In some embodiments, the reactive species generated from the plasma may contact the substrate for a time period of between approximately 2 seconds and 10 seconds.

After a time period sufficient to completely saturate and react the previously absorbed molecular layer with the nitrogen-based plasma pulse, any excess reactant and reaction byproducts may be removed from the reaction chamber. As with the removal of the first reactant, i.e., the vapor phase boron precursor, this step may comprise stopping generation of reactive species and continuing to flow an inert gas, such as a gas comprising nitrogen, helium, and in some embodiments additionally argon. The inert gas flow may flow for a time period sufficient for excess reactive species and volatile reaction byproducts to diffuse out of and be purged from the reaction chamber. For example, the purge process may be utilized for a time period between about 0.1 seconds to about 10 seconds, or about 0.1 seconds to about 4.0 seconds, or even about 0.1 seconds to about 0.5 seconds. Together, the nitrogen-based plasma provision and removal represent a second phase, i.e., a reactive species phase, in the exemplary boron nitride PEALD process 100 of FIG. 1.

The method wherein the substrate is alternately and sequentially contacted with the vapor phase boron precursor and contacted with the reactive species generated from a gas comprising a nitrogen precursor may constitute a unit deposition cycle. In some embodiments of the disclosure, the exemplary PEALD process 100 may comprise repeating the unit deposition cycle one or more times. For example, the cyclical deposition stage 105 of exemplary PEALD process 100 may continue with a decision gate 140 which determines if the PEALD process 100 continues or exits. The decision gate of process block 140 is determined based on the thickness of the boron nitride film deposited, for example, if the thickness of the boron nitride film is insufficient for the desired device structure, then the PEALD process 100 may return to the process block 120 and the processes of contacting the substrate with the boron precursor and contacting the substrate with the reactive species (process block 130) may be repeated one or more times. Once the boron nitride film has been deposited to a desired thickness the exemplary PEALD process 100 may exit by means of a process block 150 and the boron nitride film may be subjected to additional processes to form a semiconductor device structure.

While the PEALD cycle is generally referred to herein as beginning with the boron phase, it is contemplated that in other embodiments the cycle may begin with the reactive species phase. One of skill in the art will recognize that the first precursor phase generally reacts with the termination left by the last phase in the previous cycle. Thus, while no reactant may be previously absorbed on the substrate surface or present in the reaction chamber if the reactive species is the first phase in the PEALD cycle, in subsequent cycles the reactive species phase will effectively follow the boron phase. In some embodiments, one or more different PEALD cycles are provided in the deposition process.

A further overview of a non-limiting exemplary unit deposition cycle of the PEALD processes of the current disclosure is illustrated with reference to FIG. 2. As illustrated in FIG. 2, the horizontal axis represents the time parameter but does not necessarily represent the actual time length of individual processes, and the vertical axis represents an ON-state or OFF-state for gas flow and RF power, wherein a raised level on the vertical axis of each parameter represents an ON-state but the vertical axis of each line does not necessarily represent the actual quantity of the associated parameter, whereas a bottom level of each line on the vertical axis represents an OFF-state, i.e., zero gas flow, or no RF power supplied.

In brief, in a first period 210 (i.e., the precursor pulse period) of the unit deposition cycle the boron precursor may be pulsed into the reaction chamber along with a flow of carrier gas/inert gas. In this first period 210, the boron precursor may chemisorb on the surface of the substrate forming at most a monolayer. In a second period 220 (i.e., a purge period) the flow of the boron precursor is stopped and the flow of the carrier gas/inert gas continues such that the reaction chamber is purged of excess boron precursor any reaction by-products. In a third period 230 (i.e., the RF pulse period) the nitrogen precursor is introduced into the reaction chamber and a pulse of RF power is supplied to the gas to excite a plasma and generate reactive species which may react with the chemisorbed boron precursor thereby forming a boron nitride film. As shown in FIG. 2 the flow of nitrogen precursor may be allowed to stabilize for a period of time prior to applying RF power to the nitrogen precursor to produce the nitrogen-based plasma. In a fourth period 240 (i.e., a purge period) the RF power, boron precursor flow, and nitrogen precursor flow are in the OFF-state and carrier gas/inert gas flow continues thereby purging the reaction chamber of excess reactive species and any reaction by-products.

A further exemplary PEALD unit deposition cycle according to the embodiments of the disclosure is illustrated in FIG. 3. In general the unit deposition cycle of FIG. 3 is similar to that illustrated in FIG. 2 except that in this example the nitrogen precursor continuously flows during the unit deposition cycle but is vented prior to entering the reaction chamber (e.g., in time periods 310, 320, and 340) except for during the RF pulse period (e.g., time period 330). In addition a pressure control inert gas continuous flows through the unit deposition cycle and is only vented to by-pass the reaction chamber during the RF pulse period (e.g., time period 330), thereby maintaining a controlled pressure within the reaction chamber.

In some embodiments, the growth rate of the boron nitride film per unit deposition cycle of the PEALD process may be greater than 0.2 nanometers per cycle, or greater than 0.5 nanometers per cycle, or greater than 1.0 nanometer per cycle. In some embodiments, the growth rate of the boron nitride film per unit deposition cycle of the PEALD process may be greater than 0.2 nanometers per cycle, or greater than 0.5 nanometers per cycle, or greater than 1.0 nanometer per cycle at a deposition temperature of greater than 200° C.

In some embodiments, the boron nitride films of the current disclosure may be deposited to a thickness from about 3 nanometers to about 50 nanometers, or from about 5 nanometers to about 30 nanometers, or from about 5 nanometers to about 20 nanometers. These thicknesses may be achieved in feature sizes (width) below about 100 nanometers, or below about 50 nanometers, or below about 30 nanometers, or below about 20 nanometers, or even below about 10 nanometers.

In some embodiments of the disclosure, the boron nitride film may be deposited on a three-dimensional structure, e.g., a non-planar substrate comprising high aspect ratio features. In some embodiments, the step coverage of the boron nitride film may be equal to or greater than about 50%, or greater than about 60%, or greater than about 70%, or greater than about 80%, or greater than about 90%, or greater than about 95%, or greater than about 98%, or greater than about 99%, or greater in structures having aspect ratios (height/width) of more than about 2, more than about 5, more than about 10, more than about 25, more than about 50, or even more than about 100.

In some embodiments, the boron nitride films deposited according the PEALD processes disclosed herein may have superior etch resistance to comparable boron nitride films deposited by prior processes. For example, the ratio of a wet etch rate of the boron nitride films deposited by the PEALD processes of the disclosure relative to a wet etch rate of thermal silicon oxide (WERR) in dilute hydrofluoric acid (1:100) may be less 1.0, or less than 0.5, or less than 0.4, or less than 0.20, or less than 0.1, or between approximately 0.1 and approximately 1.0.

In some embodiments of the disclosure, the boron nitride films deposited according to the PEALD processes disclosed herein may have a wet etch in dilute hydrofluoric acid (1:100) (at room temperature) of less than 1.5 nanometers/minute, or less than 1.0 nanometer/minute, or even less than 0.8 nanometers/minute.

In some embodiments of the disclosure, the boron nitride film consists essentially of boron and nitrogen. In some embodiments, the boron nitride film may comprise a carbon doped boron nitride.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for forming a boron nitride film by a plasma enhanced atomic layer deposition (PEALD) process, the method comprising:
providing a substrate into a reaction chamber; and
performing at least one unit deposition cycle of a PEALD process, wherein a unit deposition cycle comprises:
contacting the substrate with a vapor phase reactant comprising a boron halide precursor, wherein the boron halide precursor comprises less than or equal to two halide atoms per boron atom; and
contacting the substrate with a reactive species generated from a plasma produced from a gas comprising a nitrogen precursor,
wherein the boron halide precursor comprises a compound having the general chemical formula:

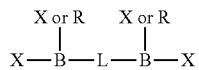

wherein X=Cl, Br, or I, and R=H, and L=$N_xH_y$, $N_xH_yC_z$, or $C_xH_y$, wherein the boron halide precursor comprises at least one of an amine group or an hydrocarbon group.

2. The method of claim 1, wherein an inert gas continuously flows into the reaction chamber during the unit deposition cycle and is vented while the plasma is produced.

3. The method of claim 1, further comprising heating the substrate to a deposition temperature of less than 500° C.

4. The method of claim 1, further comprising heating the substrate to a deposition temperature of less than 400° C.

5. The method of claim 1, wherein the boron halide precursor further comprises a hydrocarbon group.

6. The method of claim 1, wherein the boron halide precursor further comprises an amine group.

7. The method of claim 1, wherein the nitrogen precursor comprises at least one of ammonia ($NH_3$), hydrazine (N2H4), or an alkyl-hydrazine.

8. The method of claim 7, wherein the nitrogen precursor comprises tertiary butyl hydrazine ($C_4H_{12}N_2$).

9. The method of claim 1, wherein the nitrogen precursor comprises nitrogen ($N_2$) and hydrogen ($H_2$).

10. The method of claim 9, wherein a ratio of nitrogen ($N_2$) to hydrogen ($H_2$) in the nitrogen precursor is equal to or greater than 1:5.

11. The method of claim 1, further comprising regulating the pressure within the reaction chamber during the PEALD process to be in the range of 100 Pascals to 3000 Pascals.

12. The method of claim 1, further comprising heating the substrate to a deposition temperature of less than 300° C.

13. The method of claim 1, wherein the boron nitride film consists essentially of boron and nitrogen.

14. The method of claim 1, wherein the boron nitride film comprises a carbon doped boron nitride.

15. The method of claim 1, wherein the boron nitride film has a wet etch rate ratio (WERR) to thermal silicon oxide in dilute hydrofluoric acid (1:100) of less than 0.5.

16. The method of claim 15, wherein the boron nitride film has a wet etch rate ratio (WERR) to thermal silicon oxide in dilute hydrofluoric acid (1:100) of less than 0.4.

17. The method of claim 1, wherein the boron nitride film has a wet etch rate in dilute hydrofluoric acid (1:100) of less than 1 nanometer/minute.

18. The method of claim 1, wherein the growth rate of the boron nitride film is greater than 0.05 nanometers per cycle.

19. The method of claim 1, wherein the boron nitride is deposited over a non-planar substrate with a step coverage of greater than 90 percentage.

20. A method for forming a boron nitride film by a plasma enhanced atomic layer deposition (PEALD) process, the method comprising:
providing a substrate into a reaction chamber; and
performing at least one unit deposition cycle of a PEALD process, wherein a unit deposition cycle comprises:
contacting the substrate with a vapor phase reactant comprising a boron halide precursor, wherein the boron halide precursor comprises less than or equal to two halide atoms per boron atom; and
contacting the substrate with a reactive species generated from a plasma produced from a gas comprising a nitrogen precursor,
wherein the boron halide precursor comprises bisdichlorobenzenediboronic acid.

* * * * *